United States Patent [19]

Platteter et al.

[11] Patent Number: 5,083,264

[45] Date of Patent: Jan. 21, 1992

[54] PROCESS AND APPARATUS FOR SAVING AND RESTORING CRITICAL FILES ON THE DISK MEMORY OF AN ELECTROSTATOGRAPHIC REPRODUCTION MACHINE

[75] Inventors: Dale T. Platteter, Fairport; Robert S. Westfall, Rochester; Jeff C. Carter, Fairport, all of N.Y.

[73] Assignee: Xerox Corporation, Stamford, Conn.

[21] Appl. No.: 342,008

[22] Filed: Apr. 24, 1989

[51] Int. Cl.⁵ .............................. G06F 11/20
[52] U.S. Cl. .................. 395/575; 364/265.3; 364/266.5; 364/267.4; 364/285.1; 364/943.41; 364/945.7; 364/970.1; 364/DIG. 1; 364/DIG. 2
[58] Field of Search ............ 371/7, 10.1, 13; 364/200 MS File, 900 MS File; 369/53, 54, 85, 86, 87, 88, 89; 360/53

[56] References Cited

U.S. PATENT DOCUMENTS

| | | | |
|---|---|---|---|
| 4,419,725 | 12/1983 | George | 371/10.1 X |
| 4,434,487 | 2/1984 | Rubinson | 371/13 X |
| 4,699,501 | 10/1987 | Watanabe et al. | 355/14 R |
| 4,711,560 | 12/1987 | Hosaka et al. | 355/14 C |
| 4,802,117 | 1/1989 | Chrosny | 371/10.1 X |
| 4,953,122 | 8/1990 | Williams | 371/10.1 X |

OTHER PUBLICATIONS

"Spinrite", Gibson Research Corp., Owners Guide 1987, p. 35.
"Hard Disk Data Storage" Personal Computer, Gibson Research Corp. 1988.

Primary Examiner—Robert W. Beausoliel
Attorney, Agent, or Firm—Frederick E. McMullen

[57] ABSTRACT

System for saving and restoring critical files on the rigid disk of an electrostatographic reproduction machine in the event the disk becomes corrupted wherein the critical files have an identifying header sector transparent to the disk directory, with a floppy disk having a bootable locate and read utility to identify critical files and read them to blank floppy disks so as to enable the rigid disk to be rebuilt or replaced without fear of loss or destruction of the critical files, a disk rebuilding utility to rebuild the rigid disk, and a file restoration utility to restore the critical files to the rigid disk when rebuilding or replacing of the rigid disk is completed.

9 Claims, 8 Drawing Sheets

PROCESS AND APPARATUS FOR SAVING AND RESTORING CRITICAL FILES ON THE DISK MEMORY OF AN ELECTROSTATOGRAPHIC REPRODUCTION MACHINE

BACKGROUND OF THE INVENTION

The invention relates to an electrostatographic reproduction machine, and more particularly, to a system for saving critical files from a good or corrupted rigid disk, reconstructing the data on a corrupted rigid disk, and restoring critical files on the machine rigid disk in the event of a disk failure.

As reproduction machines such as copiers and printers become more versatile, feature laden, faster, etc., the amount of memory required to store not only the machine operating system software but also the program instructions, routines for diagnosing machine faults, etc., has increased enormously. This, in turn, has led to the use of rigid or hard disk memory in machines of this type.

However, rigid disks are not totally reliable and can fail or become corrupted. When this happens, it is necessary to rebuild the disk, a process normally referred to as scavenging. If the disk cannot be rebuilt, the disk must be replaced with a new disk.

When used in machines of the type alluded to, there are many files with different purposes and properties on the disk. Some of these files are critical in the sense that they are unique to the particular machine or machine installation; others during operation and use of the machine gather critical operating data such as customer billing information, data on paper jams, faults, etc. If these files become lost due to a disk fault or as a result of rebuilding or replacing the disk, this valuable data is lost which could lead to inaccurate customer billing, improper machine servicing, increased time to set up the machine, etc.

In the prior art, U.S. Pat. No. 4,711,560 to Hosaka et al discloses a copier in which a floppy disk is employed for loading programs to the copier memory, as for example, programs for collecting accounting data, servicing the copier, etc. And, U.S. Pat. No. 4,699,501 to Watanabe et al discloses a copier in which something referred to as a quick disk designed for cooperation with a display panel is used for entering special programs to the copier such as different language messages for display on the panel to instruct the user in operating the copier.

SUMMARY OF THE INVENTION

Briefly, the present invention is concerned with a process for locating and saving critical files on the rigid disk of an electrostatographic machine in the event the rigid disk has a fault, the rigid disk storing plural machine files including the critical files together with a file directory for normally locating and addressing the files, the machine including dynamic memory and floppy disk read/write means for reading and writing data between the rigid disk, the dynamic memory, and floppy disks, comprising the steps of: providing headers that are non-accessible by the file directory for each of the critical files on the rigid disk; providing a floppy utility disk with a first utility for locating and transferring the critical files to one or more floppy disks using either the file directory or the headers, a second utility for reconstructing the data on the rigid disk, and a third utility for restoring the critical files from the floppy disks back to the rigid disk following rebuilding or replacement of the rigid disk; inserting the utility disk in the read/write means; loading the first, second, and third utilities in the dynamic memory; using the first utility to locate and transfer the critical files to the blank floppy disks; using the second utility to rebuild the rigid disk if possible, and following rebuilding or replacement of the rigid disk, using the third utility to restore the critical files back to the rigid disk.

The invention further provides a means to enable critical files on a rigid disk to be saved in the event the disk is corrupted, the disk having a plurality of files including the critical files for operating an electrostatographic reproduction machine together with at least one disk directory for use in addressing the files during operation of the machine, comprising, in combination: a header sector for each of the critical files, the header sectors being located so that the disk directory points to the beginning of the files and not to the header sectors whereby the header sectors are transparent to the disk directory when the disk directory is accessing the files; each of the header sectors having a unique address pattern for identification and containing data relating to the critical file; and means to access the disk directory or the header sectors in the event of a disk fault including a floppy disk port for reading and writing data between floppy disks and the rigid disk and a floppy disk having a special utility for locating and reading the critical files to other floppy disks through the port, the special utility including means to check the operability of the disk directory and where the disk directory is operable, to locate and read the critical files from the rigid disk to the other floppy disks using the disk directory, the special utility where the disk directory is inoperable using the special headers to locate and read the critical files from the rigid disk to the other floppy disks.

DETAILED DESCRIPTION OF THE DRAWINGS

For a better understanding of the present invention, reference may be had to the accompanying drawings in which.

DETAILED DESCRIPTION OF THE PREFERRED EMBODIMENT

Figure 1:
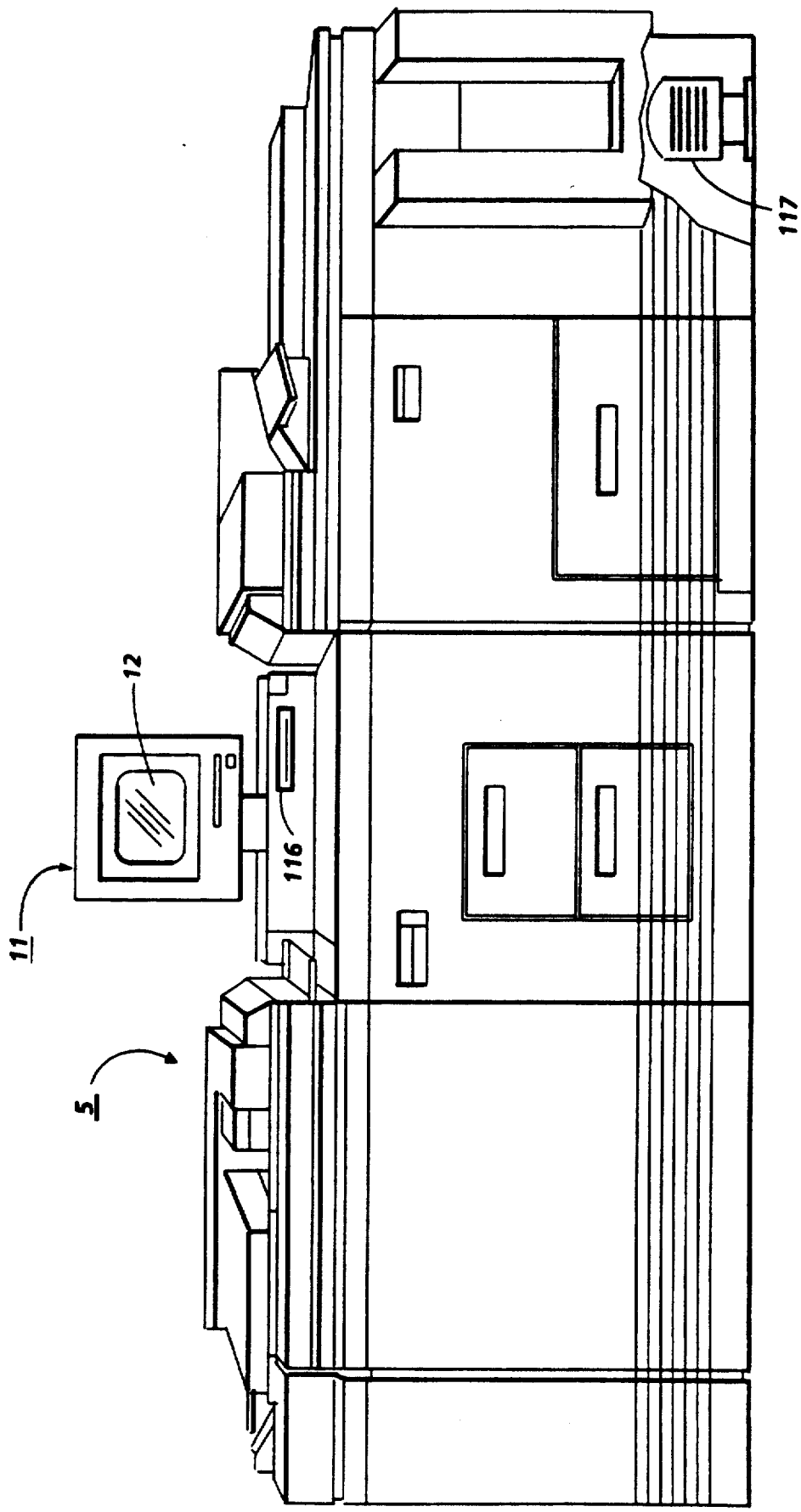
FIG. 1 is an isometric view of an illustrative reproduction machine employing a rigid disk for storing machine operating programs which is adapted to use the present invention system for saving and restoring critical disk files.
Figure 2:
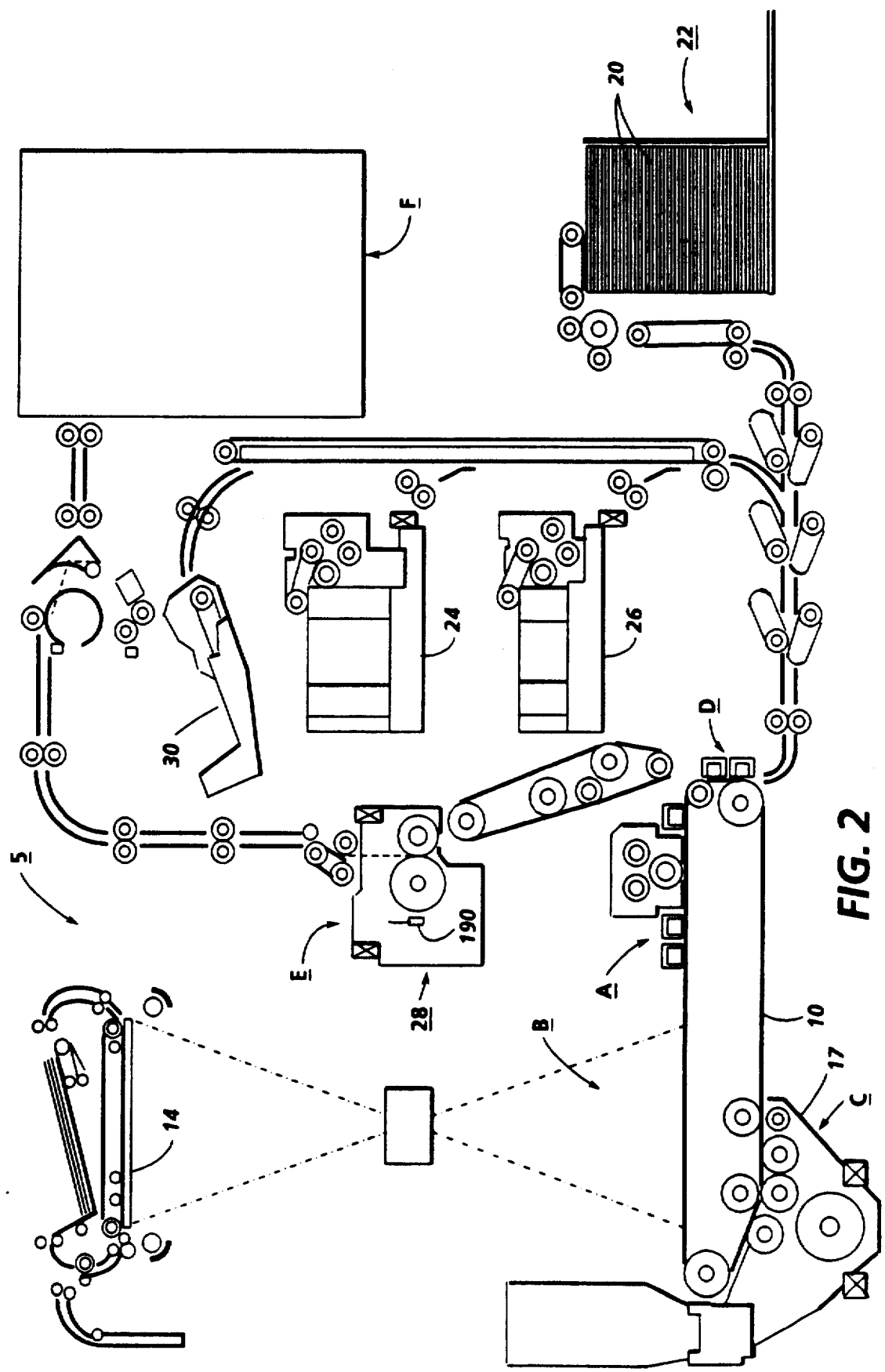
FIG. 2 is a schematic elevational view depicting various operating components and sub-systems of the machine shown in FIG. 1.

For a general understanding of the features of the present invention, reference is made to the drawings. In the drawings, like reference numerals have been used throughout to identify identical elements. Referring to FIGS. 1 and 2, there is shown an electrophotographic reproduction machine 5 composed of a plurality of programmable components and sub-systems which cooperate to carry out the copying or printing job programmed through a touch dialogue screen 12 of a User Interface (U.I.)11.

Machine 5 has a photoreceptor in the form of a movable photoconductive belt 10 which is charged at charging station A to a relatively high, substantially uniform potential. Next, the charged photoconductive belt is advanced through imaging station B where light rays reflected from the document being copied on platen 14 create an electrostatic latent image on photoconductive belt 10.

The electrostatic latent image is developed at development station C by a magnetic brush developer unit 17 and the developed image transferred at transfer station D to a copy sheet 20 supplied from tray 22, 24, or 26. Following transfer, the copy sheet bearing the transferred image is fed to fusing station E where a fuser 28 permanently affixes the toner powder image to the copy sheet. After fusing, the copy sheets are fed to either finishing station F or to duplex tray 30 from where the sheets are fed back to transfer station D for transfer of the second toner powder image to the opposed sides of the copy sheets.

Figure 3:
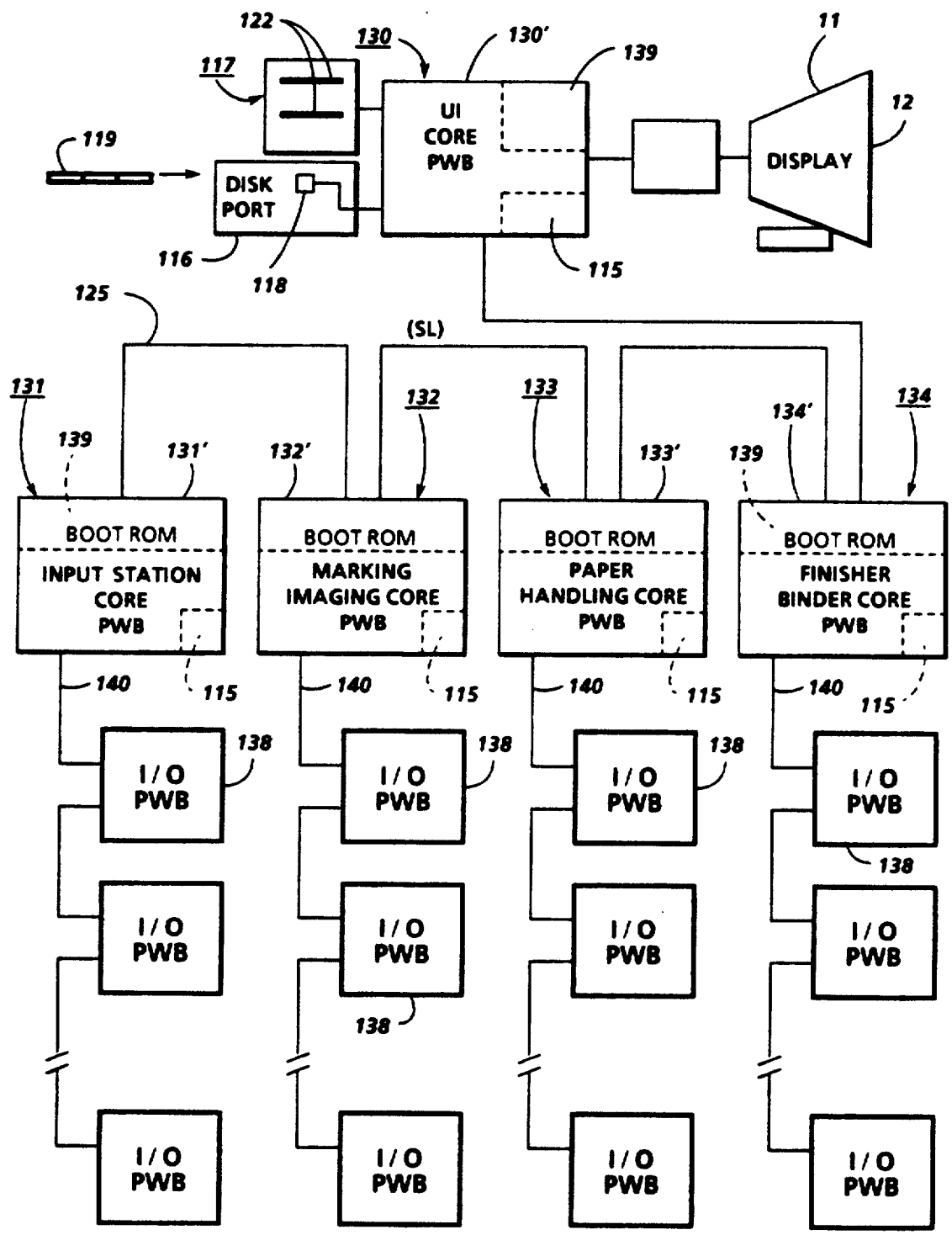
FIG. 3 is a more detailed block diagram depicting the machine Operating System Printed Wiring Boards and shared line connections together with the machine rigid disk and floppy disk port.

Referring to FIG. 3, the various functions of machine 5 are regulated by controllers 130, 131, 132, and 134. The controllers provide a comparison count of the copy sheets, the number of documents being recirculated, the number of copy sheets selected by the operator, time delays, and jam corrections. Programming and operating control over machine 5 is accomplished through U.I. 11. Operating and control information is held in dynamic memories 115 which are loaded on startup of machine 5. Job programming instructions are loaded into the controller 130 through U.I. 11. Conventional sheet path sensors or switches may be utilized to keep track of the position of the documents and the copy sheets. In addition, the controllers regulate the various positions of the gates depending upon the mode of operation selected.

Operation of the various components of machine 5 is regulated by a control system which implements Operating System software in memories 115 to operate the various machine components in an integrated fashion to produce copies. Controllers 130, 131, 132, and 134 are in the form of printed wiring boards (PWBs), there being a UI core PWB 130', an Input Station core PWB 131', a Marking Imaging core PWB 132', a Paper Handling core PWB 133', and a Finisher Binder core PWB 134' together with various Input/Output (I/O) PWBs 138. A Shared Line (SL) 125 couples the core PWBs 130', 131', 132', 133', 134' with each other while local buses 140 serve to couple the I/O PWBs 138 with each other and with their associated core PWB. Programming and operating control over machine 5 is accomplished through touch dialogue screen 12 of UI 11.

A storage media in the form of a hard or rigid disk 117 stores the machine Operating System. On machine power up, the Operating System is loaded from disk 117 to memory 115 of controller 130 and from there to the remaining memories 115 of controllers 131, 132, 133, and 134 respectively via SL 125. Disk 117 has a formatted storage capacity of approximately 20 megabytes. Additional ROM, RAM, and NVM memory types are resident at various locations within machine 5, with each core PWB 130', 131', 132', 134' having a boot ROM 139 for controlling downloading of Operating System software to the PWB, fault detection, etc. Boot ROMs 139 also enable transmission of Operating System software and control data to and from PWBs 130', 131', 132', 134' via SL 125 and control data to and from I/O PWBs 138 via local buses 140.

Figure 4:
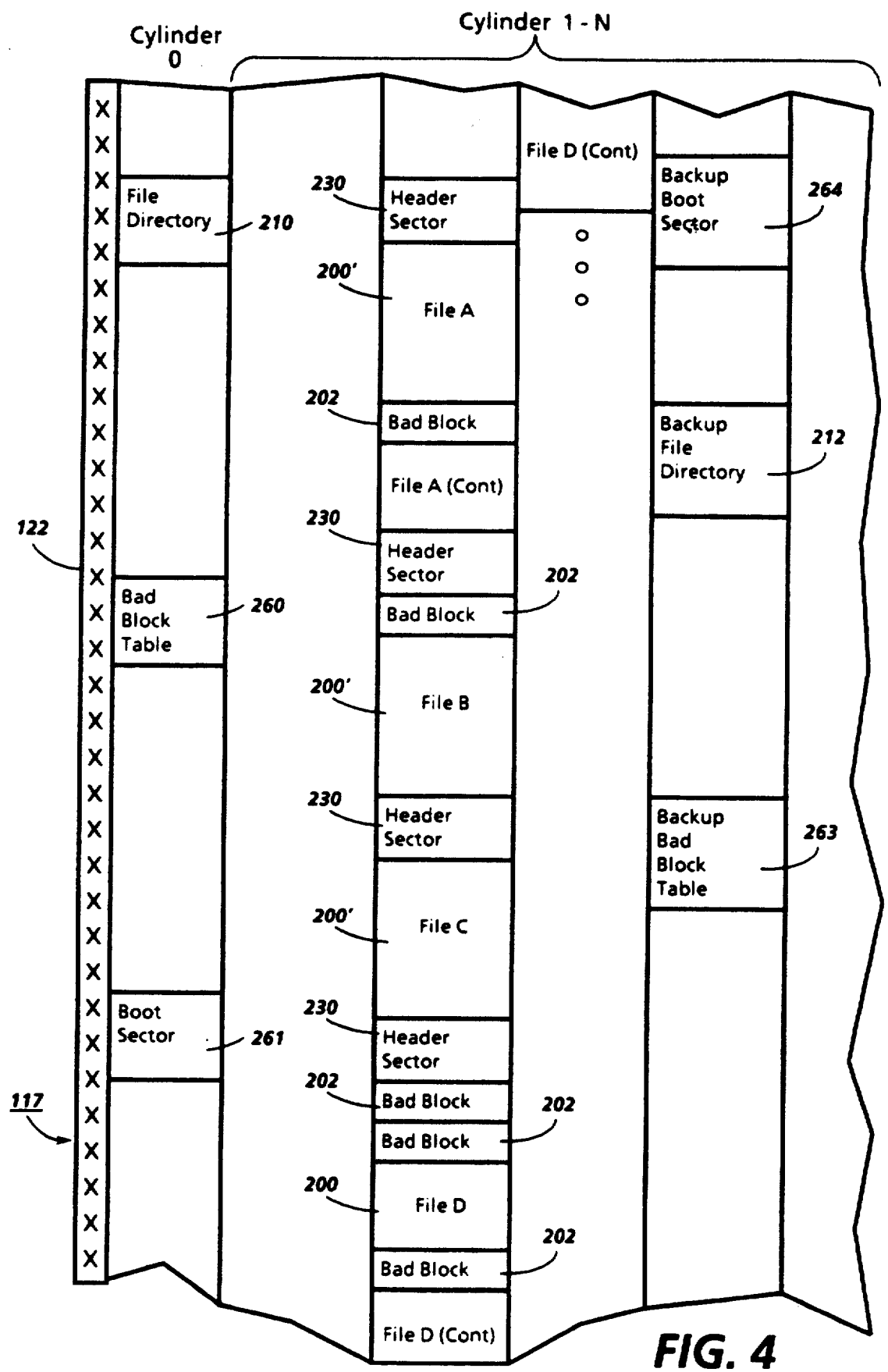
FIG. 4 is a schematic illustration of a portion of the rigid disk memory depicting disk directory and backup directory, bad block table, boot sector, and files together with the header sectors of the present invention.

Referring also to FIG. 4, rigid disk 117 consists of two double sided platters 122 with a separate head for each side of each platter 122 for a total of four heads. The path that each head covers as the platters 122 rotate is called a track; the position where the head can be placed is referred to as a cylinder. Cylinders are numbered 0 to n, with cylinder 0, which is located at the outermost edge of platters 122, being special in that cylinder 0 contains no bad blocks 202. This is a needed restriction for the implementation of the rigid disk to work properly as, for example, in the case of the bad block table 260. This table, which cannot itself be a bad block, is contained on cylinder 0. Additionally, logical sector zero (boot sector 261) is on cylinder 0 since boot sector 261 must be in a fixed location and cannot be a bad block. File or disk directory 210, which contains the location and length of each file on disk 117, is also on cylinder 0 since directory 210 cannot be a bad block. Backup file directory 212, bad block table 263, and boot sector 264 are provided on a different cylinder.

The operating system software comprises a plurality of files 200, each file 200 consisting of one or more contiguous sectors on platters 122 of disk 117. Sectors which contain media defects, referred to as bad blocks 202, are not assigned to any file. During the file layout process, the disk writing software will skip such sectors.

Directory 210 is used by the host microprocessor to locate files 200 on platters 122. Directories 210, 212 contain pointers to all of the files 200 and data that describes the size of each file. The last three bytes of the file directories contain a checksum which is used to insure that the directory is not corrupt.

A floppy disk port 116 provides program loading access to controller 130 for the purpose of entering changes to the operating system software, loading specific programs such as diagnostic programs, retrieving stored data such as machine faults, etc. using floppy disks 119. Port 116 includes a suitable read/write head 118 for reading and/or writing from and to a disk 119 in port 116. Floppy disks 119 preferably comprise 3.5 inch, dual-sided micro disks with a formatted storage capacity of approximately 720 kilobytes. For a more detailed explanation of the manner in which data is transferred using floppy disks 119, reference may be had to copending U.S. patent application Ser. No. 07/264,771, filed on 11/02/88, in the names of Dale T. Platteter et al, incorporated by reference herein.

Certain of the files 200 are so-called critical files (identified by the numeral 200'). Typically, these files contain data that is irreplaceable or at best difficult to replace such as billing, accounting, customer setup, machine operating data and history such as number of paper jams, software crashes, etc.

A header sector 230 that is transparent to both file directory 210 and backup file directory 212 is provided for each file 200 including critical files 200'. Because header sectors 210 are transparent, file directories 210, 212 are not changed nor is the manner in which the end user interfaces with files 200 on disk 117. And since the file directories 210, 212 point to the beginning of a file 200 and not to the header sector 230, any need to compensate for the additional sector of data when reading or writing normally to the file is avoided.

Figure 5:
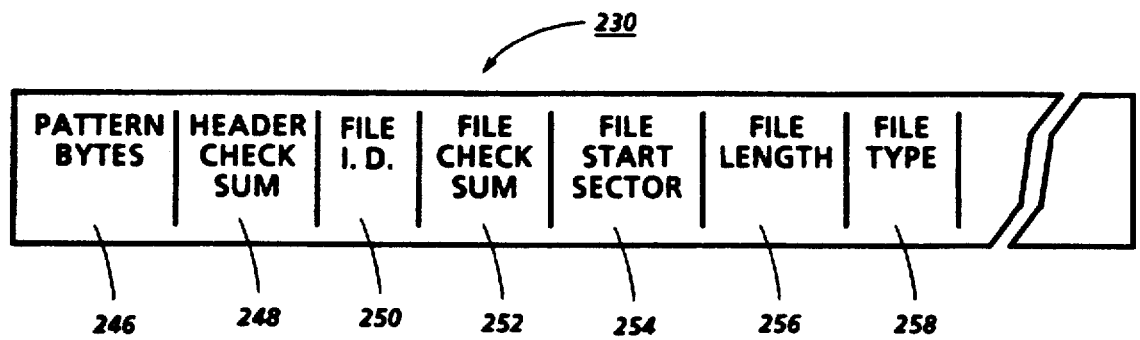
FIG. 5 is a view showing details of the header sector.

While not required, header sectors 230 are preferably located as the first good sector just before the beginning of each file 200. As shown in FIG. 5, each header sector 230 has pattern bytes 246 for uniquely identifying the sector, a header checksum 248, a file ID 250, a file checksum 252, the file starting sector number 254, the file length 256, and a file type 258, the latter distinguishing critical files 200' from non-critical files 200. Other data such as tools that have modified the file, where the file physically begins on the disk, file name used to create the file on disk, etc., may be envisioned. The header file type 258 in sectors 230 provides the information necessary to determine if a file contains critical data that needs to be saved for future restoration.

Where disk 117 becomes corrupted or for some reason fails, the disk needs to be rebuilt and where rebuilding does not cure the problem, replaced. At the same time, critical files 200' must if at all possible be saved and the data therein preserved. For this purpose, a series of utilities are provided for first locating and saving the critical files 200' on disk 117, then rebuilding the disk 117, and finally restoring the critical files to the rebuilt disk or where rebuilding has not been possible, to the new replacement disk. Since both the file directory 210 and backup file directory 212 may be unusable, the header sectors 230 enable the critical files 200' to be located and saved without requiring use of either the directory or backup directory. The utilities are provided on one or more special floppy disks (referred to as utility disks), the utility programs being loaded into the memory 115 of controller 120 through floppy disk port 116. The critical files 200' are read to one or more floppy disks, which are preferably blank, (or from the floppy disks back to the rigid disk when rebuilding or replacement of the rigid disk is completed) through port 116 as the utilities are exercised.

Figure 6:
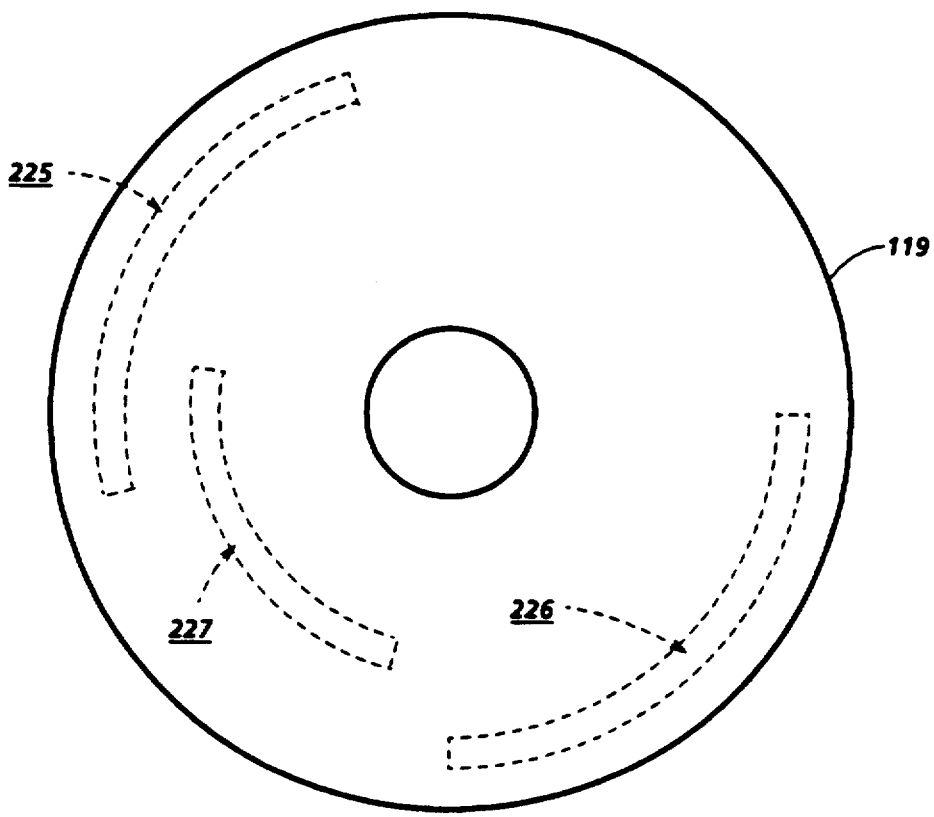
FIG. 6 is a view showing a special floppy utility disk having file locate and save, disk rebuild, and file restore utilities.
Figure 7:
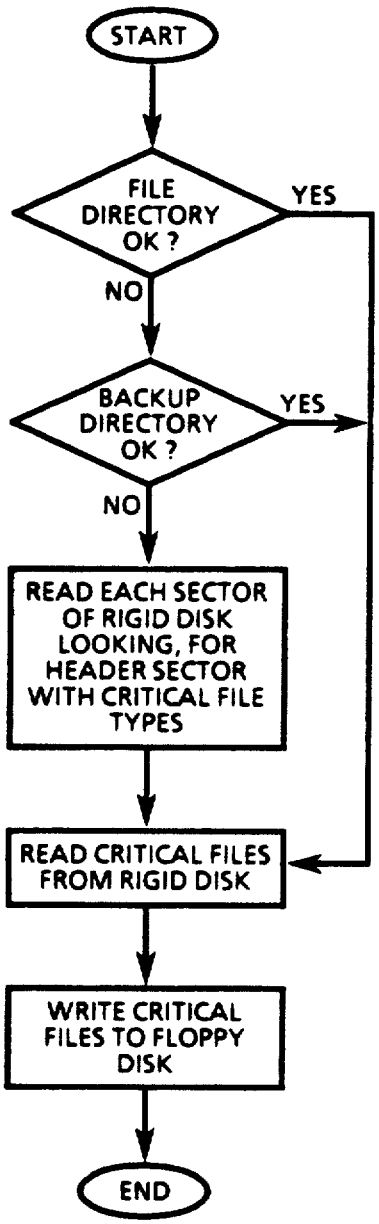
FIG. 7 is a flow chart depicting operation of the file locate and save utility.

Referring to FIGS. 6 and 7, a locate and save utility 225 serves to locate the critical files 200' on disk 117 irrespective of the condition of file directory 210 or backup directory 212. Utility 225 first attempts to locate the critical files 200' using file directory 210. Where file directory 210 is unusable, the utility attempts to use backup file directory 212 to locate the critical files. Where backup file directory 212 is unusable, utility 225 undertakes a search for the header sectors 230 associated with each critical file 200'. Using either file directory 210 or backup file directory 212, or header sectors 230, the critical files are found and read to one or more blank floppy disks 119 through floppy disk port 116. Where header sectors 230 are used, utility 225 uses the file type 258 and file ID 250 data to locate and identify the critical files. Once found, utility 225 checks the pattern bytes 246 to determine that the sector is a header sector 230 and verifies that the checksum for the header sector 230 is correct. Before saving a critical file 200', a check is made to see if the file is intact. Verification of the file is done by reading the entire file, checksumming the file, and comparing the checksum with the file checksum 252 in the header 230.

Figure 8:
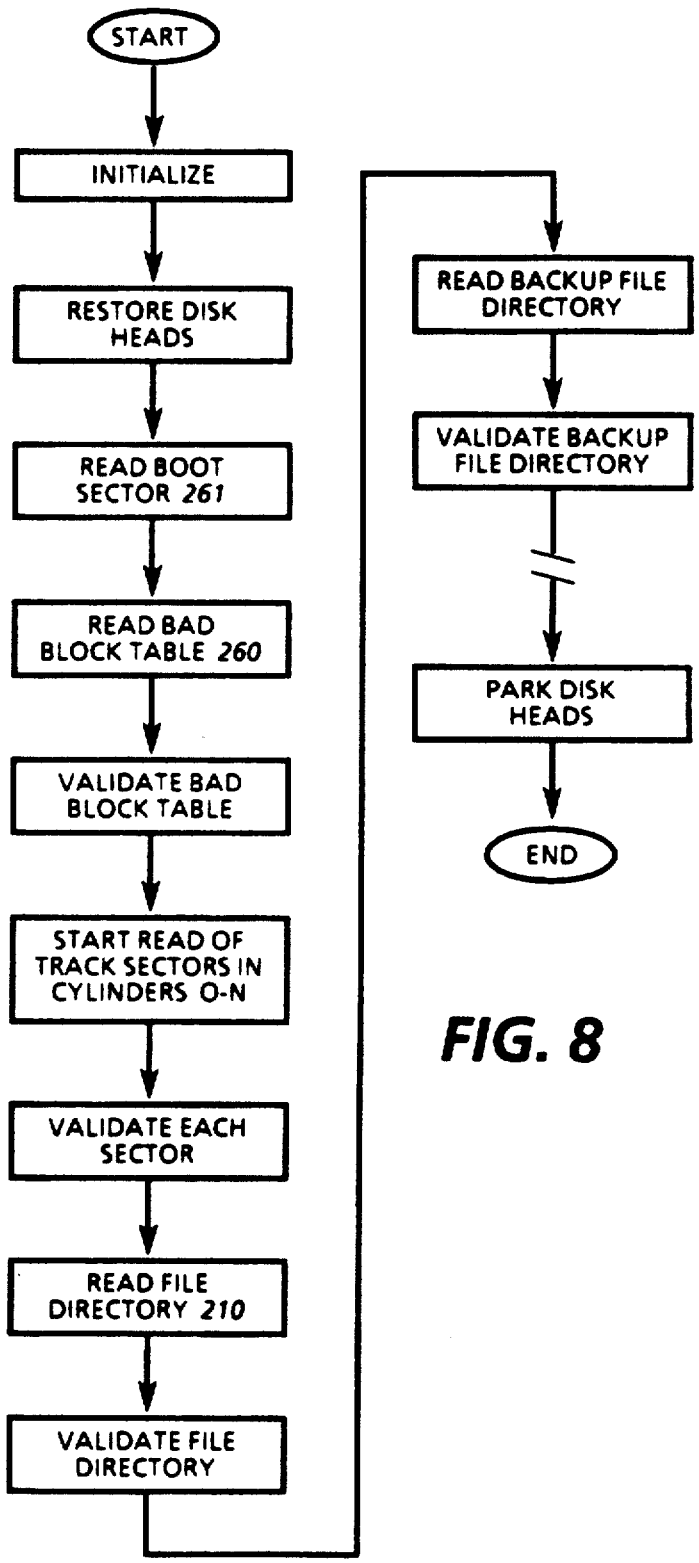
FIG. 8 is a flow chart depicting operation of the disk rebuild utility.
Figure 9:
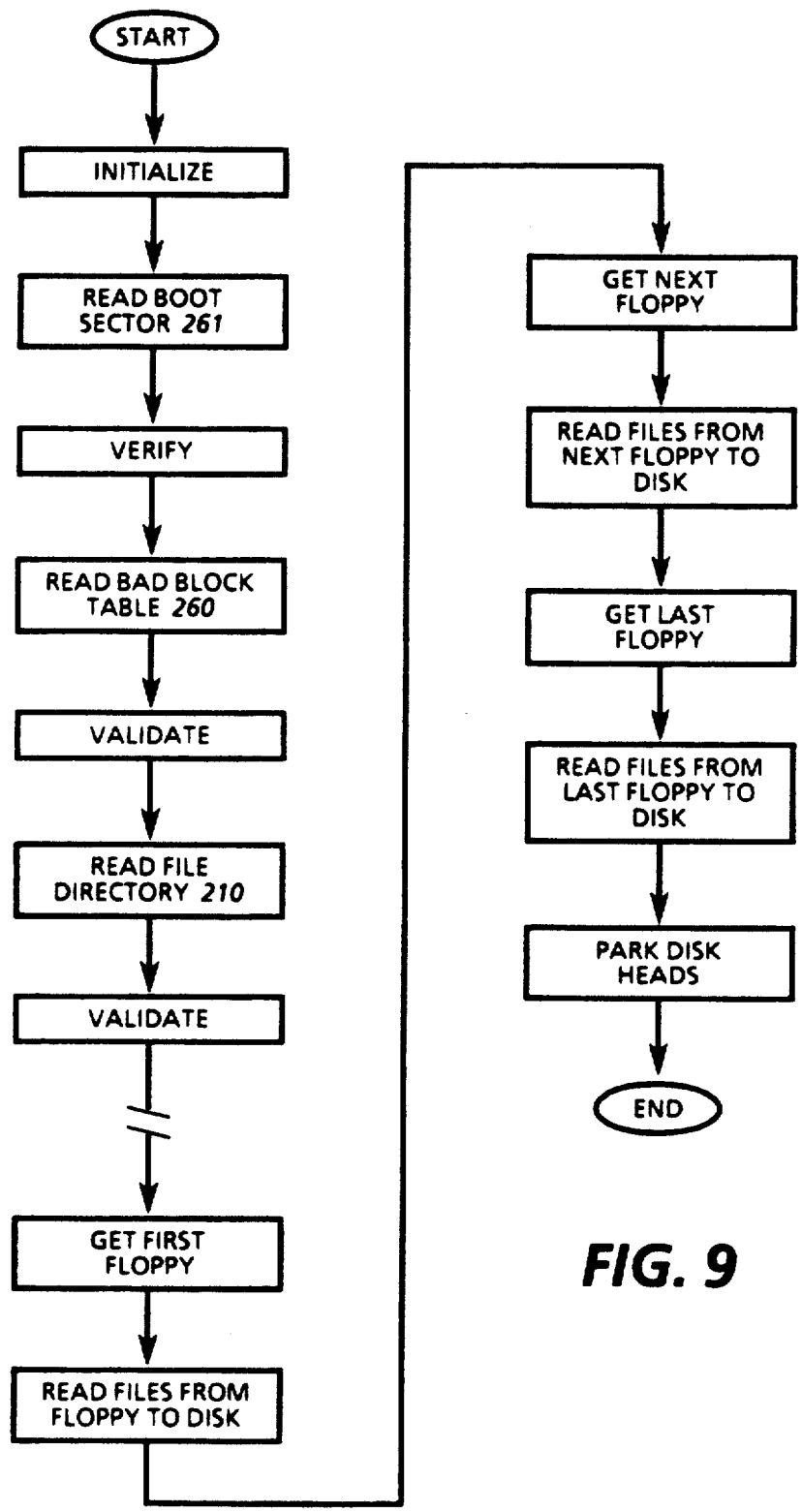
FIG. 9 is a flow chart depicting operation of the file restore utility.

Referring to FIGS. 6, 8, and 9, following reading of the critical files 200' onto floppy disks 119, a disk rebuilding or scavenging utility 226 is then used in an attempt to rebuild the disk 117 including bad block table 260. The latter is possible because when bad blocks are read from the rigid disk 117, an error is produced that uniquely identifies the blocks as having been marked bad when formatting took place. Following successful rebuilding of disk 117 or replacement of disk 117 with a new disk where rebuilding fails, the file restoration utility 227 takes the critical files stored to the blank floppy disk or disks by utility 225 and restores the critical files back to disk 117.

Figure 10:
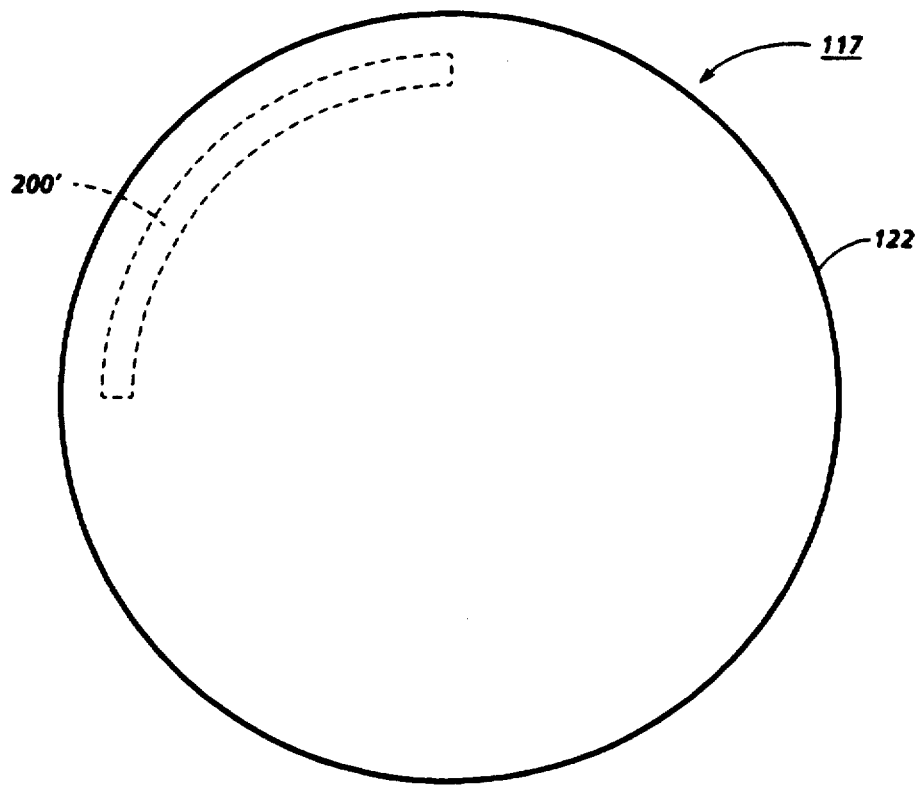
FIG. 10 is a view of a rigid disk platter depicting the positioning of the critical files to facilitate accessing.

Referring to FIG. 10, to speed up acquisition of critical files 200', files 200' and header sectors 230 may be stored in a specific area on platters 122 of disk 117. This permits the utilities 225 and 227 to go directly to that area of platters 118 and reduce the amount of search and find for header sectors 230 that is required in order to find those files having critical data.

It will be appreciated that since the underlying structure of disk 117, for example, disk directory 210, is not used, the invention can be used on valid rigid disks 117 as well as on corrupted disks.

While the invention has been described with reference to the structure disclosed, it is not confined to the details set forth, but is intended to cover such modifications or changes as may come within the scope of the following claims.

We claim:

1. A process for locating and saving critical files on a rigid disk of an electrostatographic machine in the event said rigid disk has a fault, said rigid disk storing plural machine files including said critical files together with a file directory for normally locating and addressing said files, said machine including dynamic memory and floppy disk read/write means for reading and writing data between said rigid disk, said dynamic memory, and floppy disks, comprising the steps of:
   a) providing headers that are non-accessible by said file directory for each of said critical files on said rigid disk;
   b) providing a floppy utility disk with a first utility for locating and transferring said critical files to one or more floppy disks using either said file directory or said headers and a second utility for restoring said critical files from said floppy disks back to said rigid disk following rebuilding or replacement of said rigid disk;
   c) inserting said utility disk in said read/write means;
   d) loading said first and second utilities in said dynamic memory;
   e) using said first utility to locate and transfer said critical files to said blank floppy disks; and
   f) following rebuilding or replacement of said rigid disk, using said second utility to restore said critical files back to said rigid disk.

2. The process according to claim 1 including the steps of:
   checking the integrity of said file directory, and
   where said file directory is corrupt, using said headers in place of said disk directory to locate and transfer said critical files to said floppy disks.

3. The process according to claim 2 including the step of:

verifying the integrity of said critical files before transfer of said critical files to said floppy disks.

4. The process according to claim 3 including the step of:
a) providing a third utility for rebuilding said rigid disk on said utility disk;
b) following transfer of said critical files to said floppy disks, using said third utility to rebuild said rigid disk; and
c) following rebuilding of said rigid disk by said third utility, using said second utility to restore said critical files back to said rigid disk.

5. The process according to claim 3 in which said rigid disk includes a bad block table identifying unusable sectors of said rigid disk, the step of:

using said third utility to rebuild said rigid disk including file directory and said bad block table.

6. Means to enable critical files on a rigid disk to be saved in the event said disk is corrupted, said disk having a plurality of files including said critical files for operating an electrostatographic reproduction machine together with at least one disk directory operable to address said files during operation of said machine, comprising, in combination:
a) a header sector for each of said files,
said header sectors being located so that said disk directory points to the beginning of said files and not to said header sectors whereby said header sectors are transparent to said disk directory when said disk directory is accessing said files;
b) each of said header sectors having a unique pattern for identification and containing information pertaining to the associated file and a file type to identify if the associated file is critical; and
c) means to access said disk directory or said header sectors in the event of a disk fault including
a floppy disk port for reading and writing data between a floppy disks and said rigid disk, and
a floppy disk having a special utility for locating and reading said critical files to other floppy disks through said port,
said special utility including means to check said disk directory and where said disk directory is operable, to locate and read said critical files from said rigid disk to said other floppy disks using said disk directory,
said special utility where said disk directory is not operable using said header sectors to locate and read said critical files from said rigid disk to said other floppy disks.

7. The means according to claim 6 in which said floppy disk includes a second special utility for rebuilding said rigid disk after said critical files have been read to said other floppy disks.

8. The means according to claim 7 in which said floppy disk includes a third special utility for restoring said critical files from said other floppy disks to said rigid disk after said rigid disk is rebuilt.

9. A process for safeguarding critical files on a hard disk of a xerographic duplicator to enable said critical files to be saved in response to a hard disk fault, said hard disk storing a plurality of files including said critical files for operating said duplicator and a file directory for accessing said files, and a floppy disk port for reading and writing data between a floppy disk and said hard disk, comprising the steps of:
a) providing a header for each of said files on said hard disk;
b) locating each header so that said headers comprise a first valid sector prior to a start of the file associated therewith;
c) inserting data in each of said headers for identifying critical files from other files on said hard disk;
d) making said headers transparent to said file directory whereby said headers can be used to access said files without using said file directory when said file directory is corrupt;
e) using either said file directory or said headers, identifying and reading said critical files onto blank floppy disks through said port whereby to prevent loss or damage of said critical files while said hard disk fault is being corrected or said hard disk replaced;
f) rebuilding said hard disk to remove said fault;
g) where said hard disk fault cannot be corrected by rebuilding said disk, replacing said hard disk with a new hard disk; and
h) following rebuilding or replacing of said hard disk, writing said critical files from said blank floppy disks back to said hard disk.

* * * * *